310-334 SR

XR 3,952,387

United States [11] 3,952,387

Iinuma et al. [45] Apr. 27, 1976

[54] METHOD OF MANUFACTURING AN ULTRASONIC PROBE

[75] Inventors: Kazuhiro Iinuma, Yokohama; Einoshin Itamura, Tokyo, both of Japan

[73] Assignee: Tokyo Shibaura Electric Co., Ltd., Kawasaki, Japan

[22] Filed: July 1, 1974

[21] Appl. No.: 484,929

[30] Foreign Application Priority Data

July 3, 1973 Japan ............................ 48-75152

[52] U.S. Cl. ............................ 29/25.35; 29/418; 29/628; 310/8.2; 310/9.4

[51] Int. Cl.[2] ............................ H01L 41/22

[58] Field of Search ............................ 29/25.35, 628, 418; 310/8.2, 9.4

[56] References Cited

UNITED STATES PATENTS

| | | | |
|---|---|---|---|
| 2,861,320 | 11/1958 | Gravley | 29/25.35 |
| 3,808,563 | 4/1974 | Borner et al. | 29/25.35 |

*Primary Examiner*—Carl E. Hall
*Attorney, Agent, or Firm*—Cushman, Darby & Cushman

[57] ABSTRACT

A method of manufacturing an ultrasonic probe which comprises the steps of forming a first metal electrode layer fully covering one surface of a plate-shaped piezoelectric or ultrasonic vibrator and further extending over part of the opposite surface for a prescribed length; providing a second metal electrode layer electrically insulated from the first metal electrode layer and stretched over substantially the remaining portion of said opposite surface of the plate-shaped piezoelectric vibrator; brazing one of both edge portions of a first metal plate bored with many internal slits to which both ends of a plurality of leads are jointly connected, to that part of the first metal electrode layer which is disposed flush with one end face of the aforesaid plate-shaped piezoelectric vibrator, and similarly brazing one of both edge portions of a second metal plate of the same construction to that part of the second metal electrode layer which is positioned flush with the opposite end face of said piezoelectric vibrator; bonding an ultrasonic absorber to the aforesaid opposite surface of the piezoelectric vibrator by proper adhesive so as to cause that part of the first metal electrode layer which extends over part of the opposite surface of the plate-shaped piezoelectric vibrator, the almost entire surface of the second metal electrode layer and one of both edge portions of each slitted metal plate to which a plurality of leads are jointly connected all to be interposed between said ultrasonic absorber and opposite surface of the piezoelectric vibrator; cutting the first and second metal electrode layers, the piezoelectric vibrator, and the brazed common connection sections of the first and second slitted metal plates at a prescribed interval to separate the leads in the opposite common connection sections thereof from each other, such that each cut element of the piezoelectric vibrator contains one pair of leads, thereby providing on the ultrasonic absorber an array of a plurality of independently operative piezoelectric vibrator elements positioned substantially flush with each other.

6 Claims, 7 Drawing Figures

METHOD OF MANUFACTURING AN ULTRASONIC PROBE

This invention relates to an ultrasonic probe comprising a plurality of independently operative piezoelectric vibrator elements arranged in a substantially flush state and a method of manufacturing the same.

A piezoelectric probe used with an electronic-scanning-type ultrasonic transmission and reception apparatus known as the so-called phased array system is generally of the type illustrated in FIGS. 1 and 2. This ultrasonic probe consists of a plurality of piezoelectric vibrator elements 2*a* made of piezoelectric material and spatially arranged on an ultrasonic absorber 1. Each piezoelectric vibrator element 2*a* has its top and bottom planes fitted with a pair of metal electrode layers 3*a*, 3*b*, for example, by baking. An electric signal is transmitted across said paired metal electrode layers 3*a*, 3*b* through the corresponding leads 4*a*, 4*b* for mechanical vibration of the piezoelectric vibrator element 2*a*, thereby giving forth an ultrasonic wave in the direction of an arrow indicated in FIG. 2.

Hitherto, the ultrasonic probe has been manufactured in the following manner. Separate piezoelectric vibrator elements 2*a* each having its top and bottom planes fitted with a pair of metal electrode layers 3*a*, 3*b* respectively are provided in a desired number. Separate leads 4*a*, 4*b* are, for example, soldered to one end of the paired metal electrode layers 3*a*, 3*b* respectively. Thereafter, a plurality of piezoelectric vibrator elements 2*a* thus constructed are spatially mounted on the ultrasonic absorber 1. To assure a uniform interval between the piezoelectric vibrator elements 2*a*, spacers as wide as said interval are sometimes interposed between said elements 2*a*.

According to the prior art manufacturing method, however, piezoelectric vibrator elements 2*a* are mounted one after another on the ultrasonic absorber 1, resulting in nonuniform intervals between said elements 2*a* and undesirably disposing the ultrasonic wave-emitting surfaces of the piezoelectric vibrator elements 2*a* at different heights. If such wavy disposition of the ultrasonic wave-emitting surfaces of the piezoelectric vibrator elements 2*a* takes place particularly where, in the phased array system, said elements 2*a* are successively energized with a prescribed time delay, then ultrasonic waves from said elements 2*a* will indicate nonuniform phases in a wave front substantially perpendicular to the direction in which ultrasonic waves are given forth. As the result, the ultrasonic waves produced will interfere with each other, failing to be emitted with uniform intensity, preventing the resultant ultrasonic probe from attaining high performance due to Q indicating the electric property of the ultrasonic probe and its sensitivity being rendered unstable.

Moreover, leads have to be brazed one after one, consuming a great deal of time and work and resulting in high manufacturing cost.

It is accordingly the object of this invention to provide a high quality ultrasonic probe admitting of easy, inexpensive manufacture and a method of manufacturing the same.

According to an aspect of this invention, there is provided a method of manufacturing an ultrasonic probe which comprises the steps of mounting first and second metal electrode layers on both surfaces of a plate-shaped piezoelectric vibrator; brazing to at least one of said first and second metal electrode layers that edge portion of a slitted metal plate to which a plurality of leads are jointly connected at least at one end; bonding an ultrasonic absorber to substantially the whole of one surface of the plate-shaped piezoelectric vibrator; cutting the first and second metal electrode layers, the piezoelectric vibrator and the brazed common connection section of the slitted metal plates all assembled together at a prescribed interval such that each cut element of the piezoelectric vibrator contains one pair of leads, thereby providing an array of independently operative piezoelectric vibrator elements arranged on the ultrasonic absorber in a substantially flush state.

This invention can be more fully understood from the following detailed description when taken in conjunction with the accompanying drawings, in which.

Figure 1:
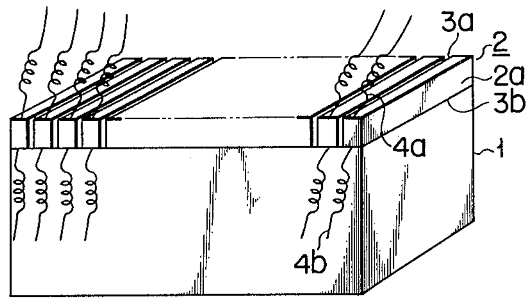
FIG. 1 PRIOR ART
FIG. 1 is an oblique view of an example of the prior art ultrasonic probe.
Figure 2:
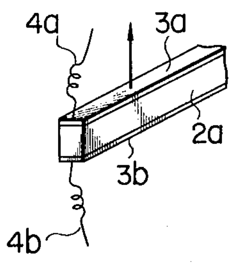
FIG. 2 PRIOR ART
FIG. 2 is an oblique view of one of the piezoelectric vibrator elements of FIG. 1.
Figure 3:
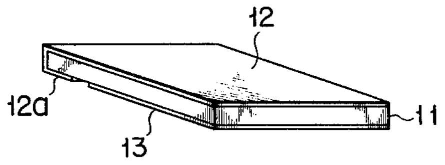
FIG. 3 is an oblique view of the ultrasonic probe of this invention.

FIGS. 3 to 6 show the sequential steps of manufacturing an ultrasonic probe by the method of this invention. Referring to FIG. 3, referential numeral 11 denotes a plate-shaped piezoelectric vibrator made of ceramic material. One surface of the piezoelectric vibrator 11 is almost fully covered with a first metal electrode layer 12. One end 12*a* of the first metal electrode layer 12 extends over part of the opposite surface of the plate-shaped piezoelectric vibrator 11 for a prescribed length. A second metal electrode layer 13 is mounted on substantially the remaining portion of said opposite surface of the piezoelectric vibrator 11 at a prescribed space from the first metal electrode layer 12 for electrical insulation therefrom. These metal electrode layers 12, 13 are made of, for example, silver and fitted to the piezoelectric vibrator 11, for example, by the known baking or evaporating process.

Figure 4:
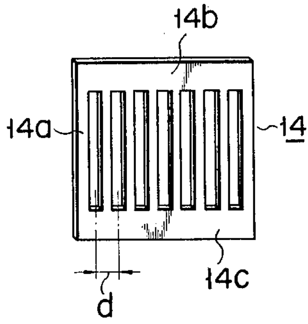
FIG. 4 is a plan view of a slitted metal plate used with the ultrasonic probe of the invention.
Figure 5:
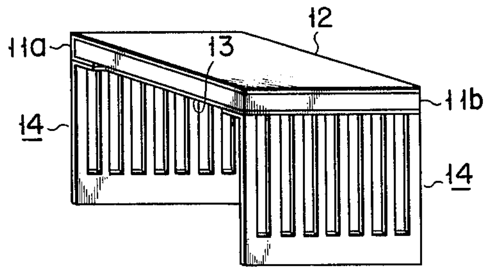
FIG. 5 is an oblique view of the ultrasonic probe of FIG. 3 fitted with slitted metal plates of FIG. 4.
Figure 6:
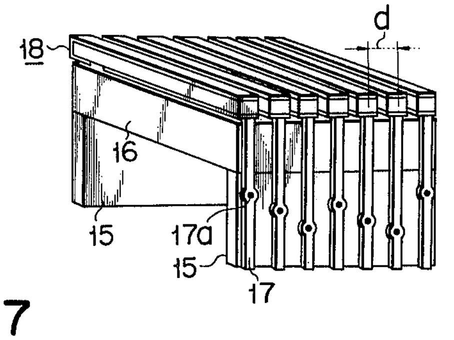
FIG. 6 is an oblique view of an ultrasonic probe manufactured by the method of the invention.

Separately, two slitted metal plates 14 shown in FIG. 4 are provided for one piezoelectric vibrator 11. Each slitted metal plate 14 comprises a plurality of ribbon-shaped jointly connected leads 14*a* parallel arranged at a prescribed interval on one surface of the slitted plate 14 and two common connection sections 14*b*, 14*c* formed at both ends of said plate 14 so as to be connected to both ends of the leads 14*a*. A distance d between the central lines of the respective leads 14*a* corresponds to that between the later described piezoelectric vibrator elements. The slitted metal plate 14 is formed, for example, by punching or hot etching. One common connection section 14*b* of the slitted metal plate 14 is bent almost at right angles to the leads 14*a*. Said bent common connection section 14*b* is brazed, as shown in FIG. 5, to one end 12*a* of the metal electrode layer 12, such that the leads 14*a* are made flush with the side wall 11*a* of the plate-shaped piezoelectric vibrator 11 on the underside thereof. On the opposite side of the piezoelectric vibrator 11, another slitted metal plate 14 is brazed to one end of the second metal electrode layer 13 on the underside of the piezoelectric vibrator 11, such that the leads 14*a* are made flush with the opposite side wall 11*b* of said vibrator 11. In this case, the common connection section 14*b* of the slitted metal plate 14 may be bent along the side wall of the piezoelectric vibrator 11 before or after brazing. In the foregoing embodiment, two slitted metal plates 14 were brazed to the metal electrode layers 12, 13. However, a slitted metal plate 14 bearing leads 14*a* may be brazed to the second metal electrode layer 13 alone, and a broad plate (not shown) free from leads 14*a* may be similarly brazed to the first metal electrode layer 12. This broad plate is used as a common connection electrode for one group of the electrodes of all piezoelectric vibrator elements. Thereafter an ultrasonic absorber 16 (FIG. 6) is bonded to the underside of the piezoelectric vibrator 11, such that one end 12*a* of the first metal electrode layer 12, tne second metal electrode layer 13 and the common connection section 14*b* of the slitted metal plates 14 are interposed between said ultrasonic absorber 16 and the underside of the piezoelectric vibrator 11.

The ultrasonic absorber 16 consists of ferrite rubber prepared by mixing ferrite powders with ordinary rubber or by mixing powders of tungsten and/or ferrite with silicone rubber, and is bonded to the entire underside of the piezoelectric vibrator 11, for example, by epoxy resin. If necessary, the ultrasonic absorber 16 is further provided under both ends with print substrates 15 on which there is formed a circuit being connected to the leads 14*a*, such that said substrates 15 are made flush with both side walls of the ultrasonic absorber 16. After the other common connection section 14*c* of the slitted metal plate 14 is cut, the leads 14*a* are connected at one end to the leads 17 provided on the substrates 15.

The metal electrode layers 12, 13, the piezoelectric vibrator 11, and the brazed common connection section 14*b* of the slitted metal plate 14 all assembled together are cut at a prescribed interval, such that each cut element 18 of the piezoelectric vibrator contains one pair of leads 14*a*. This cutting is effected by a cutting device known as a diamond cutter prepared by bonding diamond powders to the periphery of, for example, a thin disk, to such extent that the surface of the ultrasonic absorber 16 which faces the cut elements 18 of the piezoelectric vibrator 11 is slightly notched. Provision of such notches enables said cut elements 18 to be independently operated in a better isolated or insulated state. A distance d between the central lines of the respective cut elements 18 of the piezoelectric vibrator 11 is, for example, 0.5 to 1 mm and an interval between said elements 18 is 0.1 to 0.2 mm. The above-mentioned diamond cutter is well adapted for such high precision cutting. Thus, the ultrasonic probe of this invention comprises a plurality of cut elements 18 of the piezoelectric vibrator 11 juxtaposed on the ultrasonic absorber 16, each of said elements 18 being provided with first and second metal electrode layers 12, 13 and a pair of leads 14*a*. Further, where required, an insulation spacer may be placed in an interspace between the respective cut elements 18 of the piezoelectric vibrator 11.

With the ultrasonic probe of this invention manufactured through the above-mentioned steps, the respective cut elements 18 of the piezoelectric vibrator 11 have the upper surfaces rendered exactly flush with each other. Where, therefore, the subject ultrasonic probe is used with the phased array system in which the respective piezoelectric vibrator elements 18 are successively energized at a prescribed time interval, said ultrasonic probe enables the phases of ultrasonic waves to be aligned relative to the wave front perpendicular to the direction in which the ultrasonic waves are transmitted, thus attaining highly efficient transmission and reception of ultrasonic waves. Where an array of piezoelectric vibrator elements 18 generating ultrasonic waves having a wave length of, for example, 0.75 mm is repetitively operated at a frequency of 2 MHz, namely, with a cyclic period of 500 nanoseconds, while respective vibrator elements 18 are successively actuated at a time delay of 25 nanoseconds, then ultrasonic waves emitted from said ultrasonic probe have the phases well aligned relative to the wave front thereof, as experimentally proved, thereby effecting highly efficient transmission and reception of ultrasonic waves.

The manufacturing method of this invention enables a plurality of piezoelectric vibrator elements 18 each provided with a pair of leads 14*a* to be mounted on the ultrasonic absorber 16 at once, requiring far less time and work and in consequence manufacturing cost.

Figure 7:
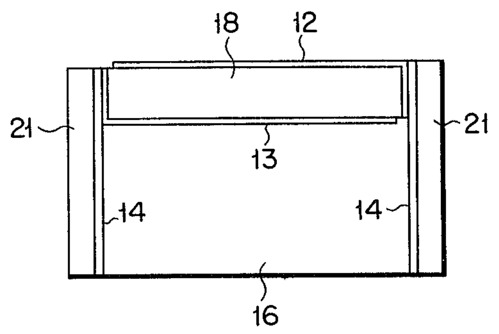
FIG. 7 is a side view of an ultrasonic probe obtained by another embodiment of the method of the invention.

FIG. 7 shows an ultrasonic probe manufactured by another embodiment of the method of this invention. According to this embodiment, the top surface and one side wall of the piezoelectric vibrator element 18 are covered with the first metal electrode layer 12 and the bottom surface and the opposite side wall thereof are provided with the second metal electrode layer 13. Both electrode layers 12, 13 are insulated from each other by a proper space. The ultrasonic absorber 16 is bonded to the underside of the piezoelectric vibrator element 18, for example, by epoxy resin, with the second electrode 13 interposed therebetween. The slitted metal plate 14 of FIG. 4 is mounted on the surface of that part of the first metal electrode layer 12 which extends over one side wall of the piezoelectric vibrator element 18 and also on the corresponding side wall of the ultrasonic absorber 16. A reinforcing member 21 is placed on said slitted plate 14. Another reinforcing member 21 is superposed on the slitted metal plate 14 fitted to the opposite side wall of the piezoelectric vibrator element 18 as well as of the ultrasonic absorber 16. An ultrasonic probe constructed as described above is cut in the same manner as in the preceding embodiment.

What we claim is:

1. A method of manufacturing an ultrasonic probe which comprises the steps of forming mutually insulated first and second metal electrode layers on both surfaces of a plate-shaped piezoelectric vibrator; brazing to each of the first and second metal electrode layers a common connection section of a slitted metal plate to which a plurality of leads are jointly connected at least at one end; bonding an ultrasonic absorber to substantially the whole surface of one of said first and second metal electrode layers; cutting through the first and second metal electrode layers, the piezoelectric and the brazed common connection section of the slitted metal plate all assembled together at prescribed intervals, such that each cut element of the piezoelectric vibrator contains one pair of leads, thereby producing an array of a plurality of independently operative piezoelectric vibrator elements arranged on the ultrasonic absorber in a substantially flush relationship and provided with an ultrasonic wave-emitting surface.

2. A method of manufacturing an ultrasonic probe which comprises the steps of forming a first metal electrode layer covering one surface of a plate-shaped piezoelectric vibrator and further extending over part of the opposite surface of said vibrator for a prescribed length; mounting a second metal electrode layer on substantially the remaining portion of said opposite surface with a small space allowed to insulate the second metal electrode layer from the first metal electrode layer; brazing a common connection section of a slitted metal plate to which a plurality of leads are jointly connected, to either that end portion of the first metal electrode layer which extends over part of the opposite surface of the plate-shaped piezoelectric vibrator or an end portion of the second metal electrode layer; bonding an ultrasonic absorber to the piezoelectric vibrator with substantially the entire surface of the second metal electrode layer and the brazed common connection section of the slitted metal plate interposed therebetween; cutting through the first and second metal electrode layers, the piezoelectric vibrator and the brazed common connection section of the slitted metal plate all assembled together at prescribed intervals, such that each cut element of the piezoelectric vibrator contains at least one lead and the leads previously jointly connected to the common connection section of the slitted metal plate are separated from each other, thereby providing an array of a plurality of independently operative piezoelectric vibrator elements bonded in a flush relationship to the surface of the ultrasonic absorber.

3. A method of manufacturing an ultrasonic probe according to claim 2 further including brazing an electrode plate, which will constitute a common connection terminal to all the piezoelectric vibrator elements in the completed probe, to the remaining first or second metal electrode layer.

4. A method of manufacturing an ultrasonic probe which comprises the steps of forming a first metal electrode layer extending over one surface and one side wall of a plate-shaped piezoelectric vibrator; providing a second metal electrode layer covering the opposite surface and opposite side wall of said piezoelectric vibrator and insulated from the first metal electrode layer; brazing a common connection section of a first slitted metal plate to which a plurality of leads are jointly connected to at least either that portion of the first metal electrode layer which covers one side wall of the piezoelectric vibrator or that portion of the second metal electrode layer which extends over the opposite side wall of said piezoelectric vibrator; brazing a common connection section of a second slitted metal plate to which a plurality of leads are jointly connected or a common connection terminal to all the piezoelectric vibrator elements, to the remaining first or second metal electrode layer; bonding an ultrasonic absorber to the opposite surface of the piezoelectric vibrator with the second metal electrode layer interposed therebetween; cutting through the first and second metal electrode layers, the piezoelectric vibrator and the brazed common connection section of each slitted metal plate all assembled together at proper intervals, such that each cut element of the piezoelectric vibrator contains one pair of leads and the leads of the other common connection section of the slitted metal plate are separated from each other, thereby providing an array of a plurality of independently operative piezoelectric vibrator elements bonded in a flush relationship to the surface of the ultrasonic absorber.

5. A method of manufacturing an ultrasonic probe which comprises the steps of forming mutually insulated first and second metal electrode layers on both surfaces of a plate-shaped piezoelectric vibrator; brazing a common connection section of a slitted metal plate to which a plurality of leads are jointly connected, to at least either an end portion of the first metal electrode layer or an end portion of the second metal electrode layer; bonding an ultrasonic absorber to substantially the whole surface of one of said first and second metal electrode layers; cutting through the first and second metal electrode layers, the piezoelectric vibrator and the brazed common connection section of the slitted metal plate all assembled together at prescribed intervals, such that each cut element of the piezoelectric vibrator contains one pair of leads, thereby producing an array of a plurality of independently operative piezoelectric vibrator elements arranged on the ultrasonic absorber in a substantially flush relationship and provided with an ultrasonic wave-emitting surface.

6. A method of manufacturing an ultrasonic probe according to claim 5 further including brazing an electrode plate, which will constitute a common connection terminal to all the piezoelectric vibrator elements in the completed probe, to the remaining first or second metal electrode layer.

* * * * *